United States Patent
Tai et al.

(10) Patent No.: US 10,230,349 B2
(45) Date of Patent: Mar. 12, 2019

(54) ACOUSTIC WAVE DEVICE

(71) Applicant: NGK INSULATORS, LTD., Aichi (JP)

(72) Inventors: Tomoyoshi Tai, Inazawa (JP); Akira Hamajima, Nagoya (JP); Yuji Hori, Owariasahi (JP)

(73) Assignee: NGK INSULATORS, LTD., Aichi (JP)

( * ) Notice: Subject to any disclaimer, the term of this patent is extended or adjusted under 35 U.S.C. 154(b) by 391 days.

(21) Appl. No.: 14/978,055

(22) Filed: Dec. 22, 2015

(65) Prior Publication Data

US 2016/0112029 A1    Apr. 21, 2016

Related U.S. Application Data

(63) Continuation of application No. PCT/JP2014/064945, filed on Jun. 5, 2014.

(30) Foreign Application Priority Data

Jul. 2, 2013 (JP) .................................. 2013-138588

(51) Int. Cl.
H03H 9/02 (2006.01)
H03H 9/25 (2006.01)
H03H 9/145 (2006.01)

(52) U.S. Cl.
CPC .......... *H03H 9/25* (2013.01); *H03H 9/02574* (2013.01); *H03H 9/02669* (2013.01); *H03H 9/145* (2013.01)

(58) Field of Classification Search
CPC ....... H03H 9/02574; H03H 9/25; H03H 9/145
See application file for complete search history.

(56) References Cited

U.S. PATENT DOCUMENTS 6,426,583 B1* 7/2002 Onishi ................. H03H 9/0222
310/313 R
2002/0149295 A1* 10/2002 Onishi ................. H03H 9/0222
310/313 R

FOREIGN PATENT DOCUMENTS

JP        62-13020 U      1/1987
JP        04-086114 A     3/1992
(Continued)

OTHER PUBLICATIONS

English language translation of International Preliminary Report on Patentability for PCT Patent App. No. PCT/JP2014/064945 (dated Jan. 5, 2016).

(Continued)

*Primary Examiner* — Thomas Dougherty
*Assistant Examiner* — Karen B Addison
(74) *Attorney, Agent, or Firm* — Cermak Nakajima & McGowan LLP; Tomoko Nakajima

(57) ABSTRACT

An acoustic wave device is an end surface reflection-type acoustic wave device and includes a substantially rectangular-parallelepiped composite substrate in which a piezoelectric substrate and a supporting substrate are joined together, with a pair of IDT electrodes provided on the substrate in such a manner as to be intercalated with each other. A chipping size in a first side face of the substrate is 1/10 of a wavelength λ of an acoustic wave or smaller, the face extending orthogonally to a direction of acoustic-wave propagation. A chipping size in a second side face of the substrate is larger than the chipping size in the face and is, for example, ½ of the wavelength λ or larger and 50 times the wavelength λ or smaller, the face extending in the direction of acoustic-wave propagation.

10 Claims, 4 Drawing Sheets

(56) References Cited

FOREIGN PATENT DOCUMENTS

| | | |
|---|---|---|
| JP | 04-298113 A | 10/1992 |
| JP | 2002-009583 A | 1/2002 |
| JP | 2002-261559 A | 9/2002 |
| JP | 2009-118504 A | 5/2009 |

OTHER PUBLICATIONS

International Search Report and Written Opinion for PCT Patent App. No. PCT/JP2014/064945 (dated Aug. 19, 2014) with English translation of the Search Report.

* cited by examiner

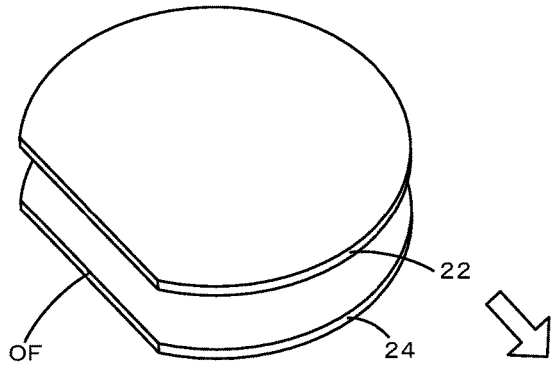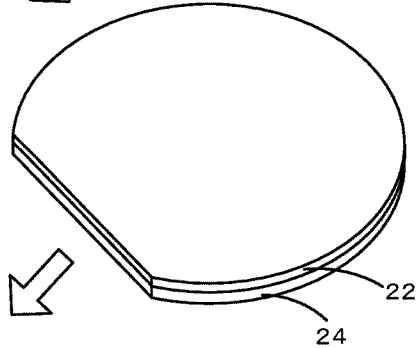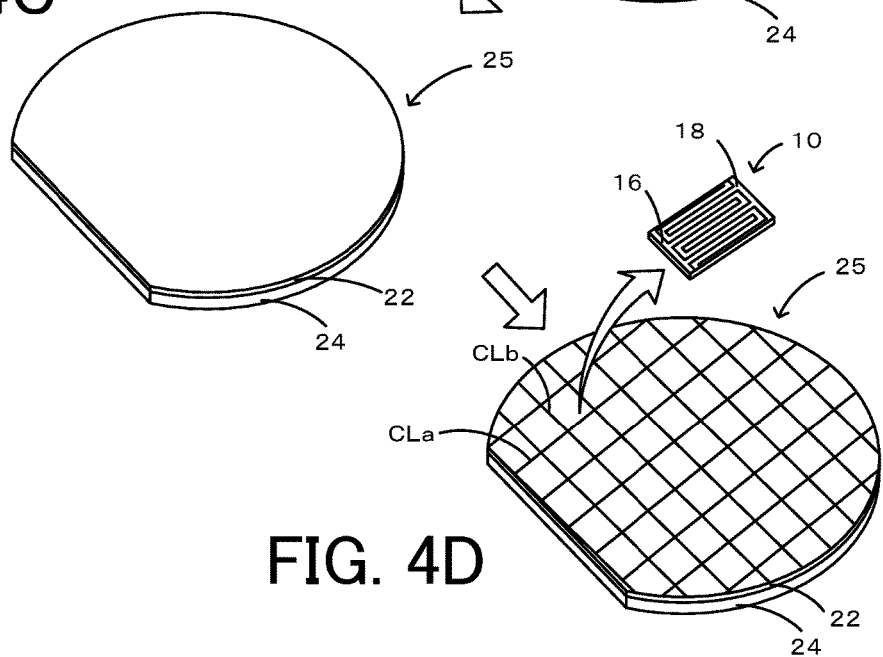

ACOUSTIC WAVE DEVICE

The present application claims priority from Japanese Patent Application No. 2013-138588, filed on Jul. 2, 2013, the entire contents of which are incorporated herein by reference.

BACKGROUND OF THE INVENTION

1. Field of the Invention

The present invention relates to an acoustic wave device.

2. Description of the Related Art

Hitherto proposed acoustic wave devices include end surface reflection-type acoustic wave devices that utilize acoustic waves reflected by edges of substrates. In such an end surface reflection-type acoustic wave device, an acoustic wave excited by IDT (interdigital-transducer) electrodes provided on a piezoelectric substrate is propagated up to edges of the substrate and is reflected by the edges. The end surface reflection-type acoustic wave device is manufactured as follows, for example. First, a disc-shaped piezoelectric wafer and a supporting wafer whose coefficient of thermal expansion is smaller than that of the piezoelectric wafer are joined together, whereby a disc-shaped composite wafer is obtained. Subsequently, the piezoelectric wafer included in the composite wafer is sectioned into a number of rectangular areas each having a predetermined size, and IDT electrodes are formed on the individual rectangular areas. Then, the composite wafer is cut into pieces of the rectangular areas by using a cutting device such as a dicing saw. This provides acoustic wave devices each including a substantially rectangular-parallelepiped composite substrate in which a piezoelectric substrate and a supporting substrate are joined together, with IDT electrodes provided on the piezoelectric substrate. The composite substrate is used for the purpose of reducing the change in the size of the piezoelectric substrate that may occur with the change in the temperature and thus suppressing the change in the frequency characteristics of the acoustic wave device that may occur with the change in the temperature.

However, when the composite wafer is cut, chipping (chip) may occur on the cut surfaces of the piezoelectric wafer. Such chipping has been a cause for the increase in the number of spurious peaks (irrelevant small peaks occurring around resonance-related peaks). To suppress the occurrence of such spurious peaks, PTL 1 and PTL 2 employ the following manufacturing methods. The method according to PTL 1 includes the following steps: (1) providing cutting grooves around rectangular areas with a dicing saw before forming IDT electrodes, (2) polishing the surface of a piezoelectric wafer and removing chipping formed around the openings of the cutting grooves, (3) forming IDT electrodes, and (4) performing cutting with a dicing saw that is thinner than the cutting grooves and obtaining pieces of acoustic wave devices. The method according to PTL 2 includes the following steps: (1) forming IDT electrodes on each of a number of rectangular areas defined on a piezoelectric wafer included in a composite wafer, (2) making cuts along rectangular areas from the side of a supporting wafer by laser cutting to a depth that does not reach the piezoelectric wafer, and (3) applying a stress that cuts the supporting wafer, thereby obtaining pieces of acoustic wave devices.

CITATION LIST

Patent Literature

PTL 1: Japanese Unexamined Patent Application Publication No. 2002-261559
PTL 2: Japanese Unexamined Patent Application Publication No. 2002-9583

SUMMARY OF THE INVENTION

PTL 1 and PTL 2 above describe suppressing the occurrence of spurious peaks by removing chipping in the edges that reflect the acoustic wave, i.e., the edges each extending orthogonally to the direction of acoustic-wave propagation. However, edges each extending in the direction of acoustic-wave propagation are not considered in PTL 1 and PTL 2. The present inventors have found that edges each extending in the direction of acoustic-wave propagation and being smooth without chipping reflect irrelevant acoustic waves, and such reflection is one of the causes for the increase in the number of spurious peaks.

The present invention is to solve the above problem and chiefly aims to more assuredly suppress the occurrence of spurious peaks in an end surface reflection-type acoustic wave device.

The acoustic wave device according to the present invention is an end surface reflection-type acoustic wave device comprising a substantially rectangular-parallelepiped composite substrate in which a supporting substrate and a piezoelectric substrate are joined together, with a pair of IDT electrodes provided on the piezoelectric substrate in such a manner as to be intercalated with each other, wherein a chipping size in a first side face of the piezoelectric substrate is $1/10$ of a wavelength $\lambda$ of an acoustic wave or smaller, the first side face extending orthogonally to a direction of acoustic-wave propagation, and wherein a chipping size in a second side face of the piezoelectric substrate is larger than the chipping size in the first side face and is $1/2$ of the wavelength $\lambda$ of the acoustic wave or larger and 50 times the wavelength $\lambda$ of the acoustic wave or smaller, the second side face extending in the direction of acoustic-wave propagation.

In the above acoustic wave device, the chipping size in the first side face that reflects an acoustic wave at a desired wavelength is $1/10$ of the wavelength $\lambda$ of the acoustic wave or smaller. Therefore, the amount of reflection by the first side face is satisfactorily large. Furthermore, changes in the phase of the acoustic wave due to changes in the position of the first side face are less likely to occur. Therefore, the occurrence of spurious peaks accompanying such changes in the phase can be suppressed. On the other hand, the chipping size in the second side face is larger than the chipping size in the first side face, specifically, $1/2$ of the wavelength $\lambda$ of the acoustic wave or larger and 50 times the wavelength $\lambda$ of the acoustic wave or smaller. Therefore, any acoustic waves at irrelevant wavelengths are less likely to be reflected by the second side face. In this respect also, the occurrence of spurious peaks can be suppressed. If the chipping size in the second side face is smaller than $1/2$ of the wavelength $\lambda$, any acoustic waves at irrelevant wavelengths are more likely to be reflected by the second side face. Accordingly, spurious peaks are more likely to occur, which is not preferable. If the chipping size in the second side face is larger than 50 times the wavelength $\lambda$, the Q factor of the resonator is lowered, which is not preferable.

In the acoustic wave device according to the present invention, it is preferable that the chipping size in the second side face be 12.5 times the wavelength λ of the acoustic wave or larger and 50 times the wavelength λ of the acoustic wave or smaller. If so, the occurrence of spurious peaks can be suppressed more assuredly.

In the acoustic wave device according to the present invention, it is preferable that the supporting substrate have a smaller coefficient of thermal expansion than the piezoelectric substrate. If so, the change in the size of the piezoelectric substrate that may occur with the change in the temperature can be reduced, and the change in the frequency characteristics of the acoustic wave device that may occur with the change in the temperature can be reduced.

BRIEF DESCRIPTION OF THE DRAWINGS

FIGS. 4A-4D include perspective views illustrating the flow of manufacturing the acoustic wave device 10.

DESCRIPTION OF THE PREFERRED EMBODIMENTS

Figure 1:
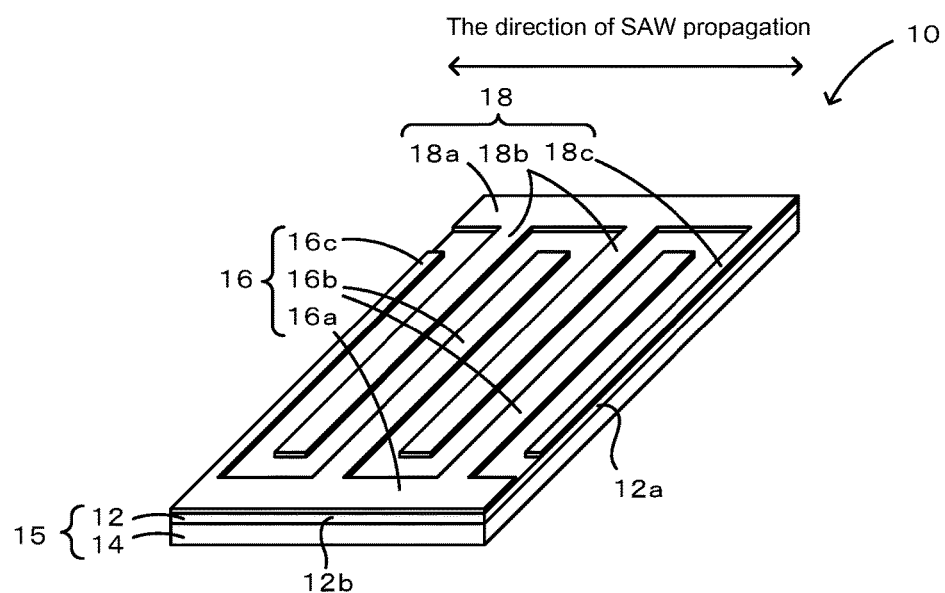
FIG. 1 is a perspective view of an acoustic wave device 10.
Figure 2:
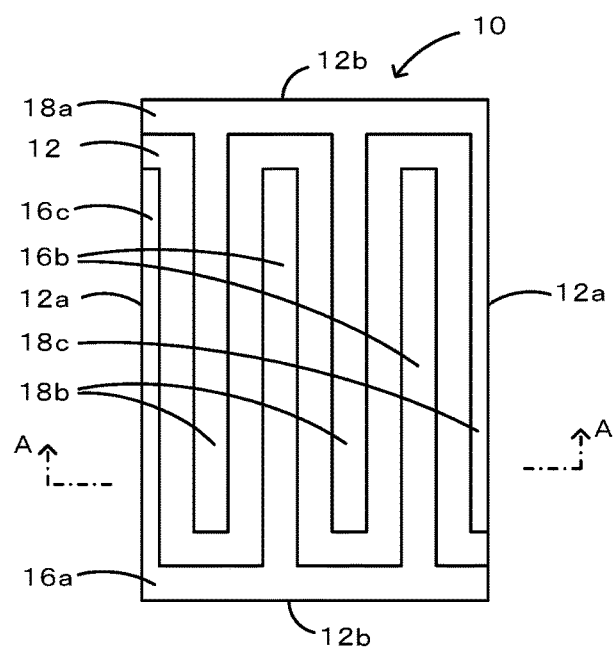
FIG. 2 is a plan view of an acoustic wave device 10.
Figure 3:
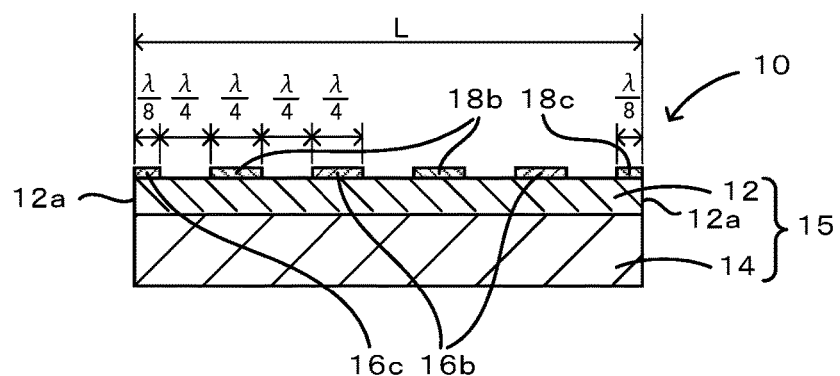
FIG. 3 is a sectional view taken along line A-A illustrated in FIG. 2.

An embodiment of the present invention will now be described with reference to the drawings. FIGS. 1 and 2 are a perspective view and a plan view, respectively, of an acoustic wave device 10 according to the embodiment. FIG. 3 is a sectional view taken along line A-A illustrated in FIG. 2.

The acoustic wave device 10 is an edge-reflection acoustic wave device and includes a substantially rectangular-parallelepiped composite substrate 15 in which a piezoelectric substrate 12 and a supporting substrate 14 are joined together, with a pair of IDT electrodes 16 and 18 provided on the piezoelectric substrate 12 in such a manner as to be intercalated with each other.

The piezoelectric substrate 12 is capable of propagating surface acoustic waves (SAWs). The piezoelectric substrate 12 is made of any of lithium tantalate (LT), lithium niobate (LN), solid-solution single crystal of lithium niobate and lithium tantalate, a crystal, lithium borate, zinc oxide, aluminum nitride, langasite (LGS), langatate (LGT), and the like. Among the foregoing materials, LT or LN is preferable. LT and LN each propagate SAWs at a high speed and each have a high electromechanical coupling coefficient. Therefore, LT and LN are each suitable for a high-frequency, wide-band acoustic wave device. The thickness of the piezoelectric substrate 12 is not particularly limited and may be, for example, 0.2 to 50 ∝m. The piezoelectric substrate 12 has first side faces 12a each extending orthogonally to a direction of acoustic-wave propagation (a direction of SAW propagation), and second side faces 12b each extending in the direction of SAW propagation. Letting the wavelength of the SAW excited be λ and the distance between the first side faces 12a that are opposite each other be L (see FIG. 3), L is designed to be an integral multiple of λ/2.

The supporting substrate 14 has a smaller coefficient of thermal expansion than the piezoelectric substrate 12 and is joined to the back surface of the piezoelectric substrate 12 directly or with an organic adhesive layer interposed therebetween. Since the supporting substrate 14 has a smaller coefficient of thermal expansion than the piezoelectric substrate 12, the change in the size of the piezoelectric substrate 12 that may occur with the change in the temperature is reduced. Hence, in a case where the composite substrate 15 is used for forming the acoustic wave device 10, the change in the frequency characteristics that may occur with the change in the temperature can be reduced. The supporting substrate 14 is made of any of silicon, sapphire, aluminum nitride, alumina, borosilicate glass, silica glass, and the like. Silicon or sapphire is preferable. The thickness of the supporting substrate 14 is not particularly limited and may be, for example, 200 to 1200 ∝m.

The composite substrate 15 is formed of the piezoelectric substrate 12 and the supporting substrate 14 that are joined together. The joining may be either direct joining or indirect joining using an organic adhesive layer. The composite substrate 15 obtained in such a manner is a rectangular parallelepiped body. The size of the composite substrate 15 is not particularly limited and may be, for example, 1 mm by 2 mm or 2 mm by 2.5 mm in length by width.

The IDT electrode 16 includes a base portion 16a extending in the direction of SAW propagation, wide electrode fingers 16b each extending from the base portion 16a in the direction orthogonal to the direction of SAW propagation, and a narrow electrode finger 16c extending from the base portion 16a in the direction orthogonal to the direction of SAW propagation and provided at an end in the direction of SAW propagation. Likewise, the IDT electrode 18 includes a base portion 18a, wide electrode fingers 18b, and a narrow electrode finger 18c. The two IDT electrodes 16 and 18 are spaced apart from each other so as not to be in contact with each other. Specifically, one of the two wide electrode fingers 16b of the IDT electrode 16 extends in a space between the two adjacent wide electrode fingers 18b of the IDT electrode 18, while the other extends in a space between one of the wide electrode fingers 18b and the narrow electrode finger 18c. Referring to FIG. 3, letting the wavelength of the surface acoustic wave to be excited be λ, the width of each of the wide electrode fingers 16b and 18b is λ/4, the width of the gap between adjacent ones of the electrode fingers is also λ/4, and the width of each of the narrow electrode fingers 16c and 18c is λ/8.

In the acoustic wave device 10 configured as described above, a SAW excited by the IDT electrodes 16 and 18 and having the wavelength λ is propagated up to each of the first side faces 12a of the piezoelectric substrate 12 and is reflected by the first side face 12a. In the embodiment, the chipping size in the first side face 12a is 1/10 of the wavelength λ of the SAW or smaller. Therefore, the amount of reflection by the first side face 12a is satisfactorily large. Furthermore, since the profile accuracy of the first side face 12a is high, changes in the phase of the SAW due to changes in the position of the first side face 12a are less likely to occur. Therefore, the occurrence of spurious peaks accompanying such changes in the phase can be suppressed. On the other hand, the chipping size in each of the second side faces 12b is larger than the chipping size in the first side face 12a, specifically, ½ of the wavelength λ or larger and 50 times the wavelength λ or smaller. Therefore, any SAWs at irrelevant wavelengths are less likely to be reflected by the second side face 12b. In this respect also, the occurrence of spurious peaks can be suppressed.

Now, a method of manufacturing the acoustic wave device 10 will be described with reference to FIGS. 4A-4D. FIGS. 4A-4D include perspective views illustrating the flow of manufacturing the acoustic wave device 10.

First, a disc-shaped piezoelectric wafer 22 having an orientation flat (OF), and a supporting wafer 24 having the same shape as the piezoelectric wafer 22 are prepared (see FIG. 4A). Subsequently, joining surfaces of the respective wafers 22 and 24 are cleansed, so that any dirt on the joining surfaces are removed. Subsequently, an ion beam of an inert gas such as argon is applied to the joining surfaces of the respective wafers 22 and 24, whereby any impurities (oxide films and any other adhering matter) remaining thereon are removed, and the joining surfaces are activated. Subsequently, in a vacuum and at room temperature, the wafers 22 and 24 are positioned such that the OFs of the two coincide with each other, and the wafers 22 and 24 are bonded together (see FIG. 4B). Subsequently, the front surface of the piezoelectric wafer 22 is polished to a predetermined thickness. Thus, a composite wafer 25 is complete (see FIG. 4C). Subsequently, electrodes intended for acoustic wave devices are formed on the front surface of the piezoelectric wafer 22 included in the composite wafer 25. The front surface of the piezoelectric wafer 22 is sectioned such that a number of acoustic wave devices are to be obtained. The above-described IDT electrodes 16 and 18 are photolithographically formed at positions corresponding to each of the acoustic wave devices. Lastly, the composite wafer 25 is diced along the sectioning lines. Thus, a number of acoustic wave devices 10 are obtained (see FIG. 4D).

Figure 5A:
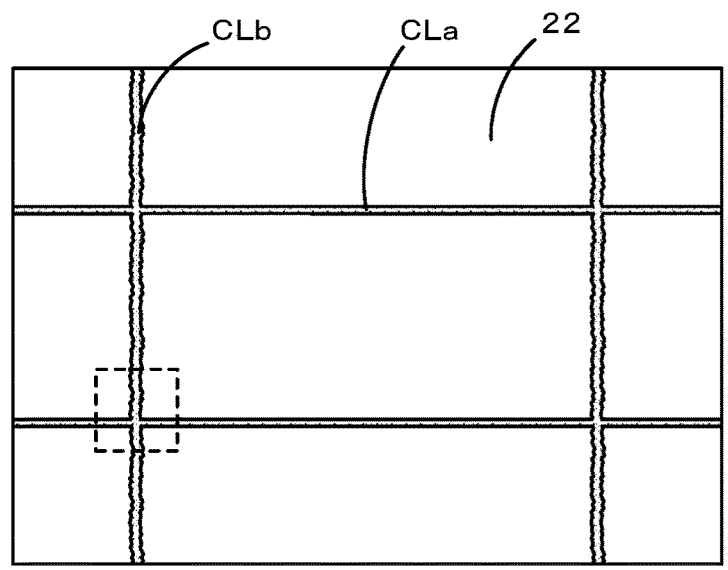
FIGS. 5A-5B include diagrams illustrating the dicing.
Figure 5B:
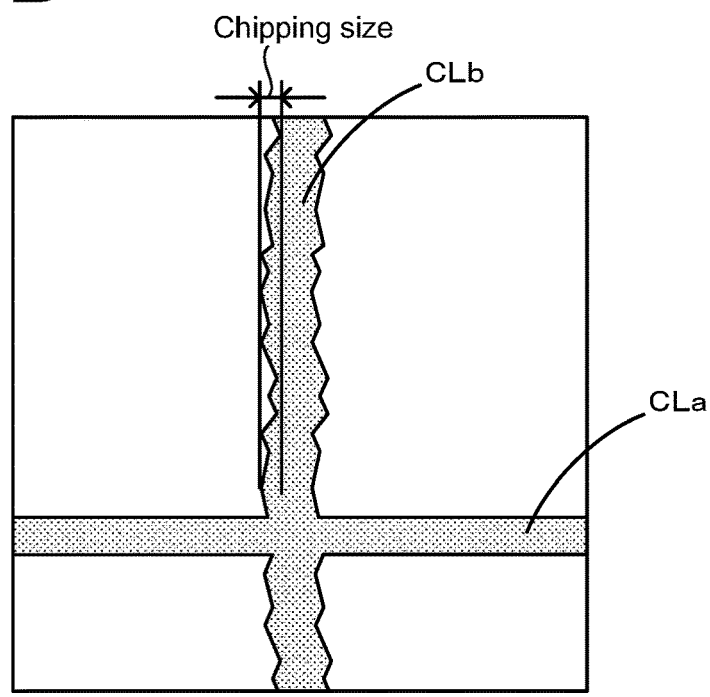

FIGS. 5A-5B include diagrams illustrating the dicing. Part (a) is a plan view of the composite wafer 25, and part (b) is an enlarged view of an area enclosed by a dotted line in part (a). Before dicing the composite wafer 25, a blade is selected such that cut surfaces to be obtained along cutting lines CLa that are to form the first side faces 12a of the acoustic wave devices 10 have chipping of 1/10 of the wavelength $\lambda$ or smaller. Furthermore, the number of revolutions and the feeding speed of the blade are adjusted or blades of different roughness or different thicknesses are selectively used such that cut surfaces to be obtained along cutting lines CLb that are to form the second side faces 12b of the acoustic wave devices 10 have chipping of 1/2 of the wavelength $\lambda$ or larger and 50 times the wavelength $\lambda$ or smaller. Note that the chipping size refers to the size of the largest one of concavities or convexities formed in the cut surface.

In the acoustic wave device 10 according to the embodiment described above, the chipping size in the first side face 12a that reflects a SAW at a desired wavelength $\lambda$ is 1/10 of the wavelength $\lambda$ of the SAW or smaller. Therefore, the amount of reflection by the first side face 12a is satisfactorily large. Furthermore, changes in the phase of the SAW due to changes in the position of the first side face 12a are less likely to occur. Therefore, the occurrence of spurious peaks accompanying such changes in the phase can be suppressed. On the other hand, the size of chipping in the second side face 12b is larger than the chipping size in the first side face 12a (specifically, 1/2 of the wavelength $\lambda$ or larger and 50 times the wavelength $\lambda$ or smaller). Therefore, any SAWs at irrelevant wavelengths are less likely to be reflected by the second side face 12b. In this respect also, the occurrence of spurious peaks can be suppressed.

Needless to say, the present invention is not limited to the above embodiment in any way and can be embodied in various other ways within the technical scope of the present invention.

For example, the cutting along the cutting lines CLa and the cutting lines CLb that is performed with blades in the above embodiment may be performed by laser cutting. In that case, laser irradiation conditions may be set in accordance with the chipping sizes that are specified for the respective cutting lines CLa and CLb. Alternatively, after cutting is performed along the cutting lines CLa and CLb under laser irradiation conditions that form smooth cut surfaces, the chipping size in the cut surfaces obtained along the cutting lines CLb may be increased by roughening the cut surfaces with a file or the like.

In the above embodiment, the piezoelectric wafer 22 and the supporting wafer 24 are bonded together by directly joining the two with an ion beam. Instead of using an ion beam, a method using a plasma or neutral-atom beam may be employed.

In the above embodiment, the piezoelectric wafer 22 and the supporting wafer 24 are bonded together by directly joining the two. Alternatively, the piezoelectric wafer 22 and the supporting wafer 24 may be joined together with an organic adhesive layer interposed therebetween. In that case, organic adhesive is evenly applied to one of or both the front surface of the supporting wafer 24 and the back surface of the piezoelectric wafer 22, and the organic adhesive is solidified with the two substrates superposed on each other, whereby the two substrates are joined together.

EXAMPLES

Example 1

A disc-shaped, 42°-Y-cut, X-propagation LT substrate (having a thickness of 250 ∝m) was prepared as a piezoelectric wafer in which the direction of SAW propagation was the X direction and a rotated Y cut substrate having a cut angle. Furthermore, a disc-shaped Si(111) substrate (having a thickness of 230 ∝m) was prepared as a supporting wafer. The two wafers were put into a vacuum chamber that was at $2.10^{-6}$ (Pa), and an argon beam was applied to the respective surfaces for 60 seconds. Subsequently, the surfaces of the two wafers to which the beam had been applied were brought into contact with each other, and the two wafers were pressed together at 2000 kg. Thus, the two wafers were directly joined together. The joined body was removed from the vacuum chamber, and the LT surface was ground to 30 ∝m. Subsequently, while diamond slurry (having a particle size of 1 ∝m) was dropped, the joined body was polished to 25 ∝m with a tin platen. Furthermore, while colloidal silica (having a particle size of 20 nm) was dropped, the joined body was polished to 20 ∝m with a urethane pad. Thus, a composite wafer intended for acoustic wave devices were obtained. Subsequently, IDT electrodes were photolithographically formed on each of a number of rectangular areas (2 mm by 1 mm) sectioned on the LT surface of the composite wafer, and the composite wafer was died into pieces of the rectangular areas. Thus, a number of acoustic wave devices were obtained. The design value of the wavelength $\lambda$ of the SAW was set to 4 ∝m. The dicing was performed by using blades. The blade used in cutting in the direction (along the cutting lines CLa illustrated in FIGS. 5A-5B) that is orthogonal to the direction of SAW propagation had a thickness of 0.05 mm and was of #2000. The cutting was performed at a number of revolutions of 29000 rpm and at a feeding speed of 20 mm/s. The blade used in cutting in the direction of SAW propagation (along the cutting lines CLb illustrated in FIGS. 5A-5B) had a thickness of 0.1 mm and was of #500. The cutting was performed at a number of revolutions of 29000 rpm and at a feeding speed of 50 mm/s. In each of the thus obtained acoustic wave devices, the chipping size in the first side face extending orthogonally to the direction of SAW propagation was 0.4

∝m (0.1 of λ), and the chipping size in the second side face extending in the direction of SAW propagation was 50 ∝m (12.5 times λ). Data on Example 1 are summarized in Table 1.

Example 2

As in Working Example 1, a composite wafer on which IDT electrodes were formed was fabricated and was diced under processing conditions for Example 2 that are summarized in Table 1. In each of the thus obtained acoustic wave devices, the chipping size in the first side face was 0.4 ∝m (0.1 of λ), and the chipping size in the second side face was 2 ∝m (0.5 of λ).

Example 3

As in Working Example 1, a composite wafer on which IDT electrodes were formed was fabricated and was diced under processing conditions for Example 3 that are summarized in Table 1. In each of the thus obtained acoustic wave devices, the chipping size in the first side face was 0.4 ∝m (0.1 of λ), and the chipping size in the second side face was 200 ∝m (50 times λ).

Comparative Example 1

As in Working Example 1, a composite wafer on which IDT electrodes were formed was fabricated and was diced under processing conditions for Comparative Example 1 that are summarized in Table 1. In each of the thus obtained acoustic wave devices, the chipping sizes in the first and second side faces were both 10 ∝m or smaller, specifically, 0.4 ∝m (0.1 of λ).

Comparative Example 2

As in Working Example 1, a composite wafer on which IDT electrodes were formed was fabricated and was diced under processing conditions for Comparative Example 2 that are summarized in Table 1. In each of the thus obtained acoustic wave devices, the chipping size in the first side face was 0.4 ∝m (0.1 of λ), and the chipping size in the second side face was 240 ∝m (60 times λ).

Comparative Example 3

As in Working Example 1, a composite wafer on which IDT electrodes were formed was fabricated and was diced under processing conditions for Comparative Example 3 that are summarized in Table 1. In each of the thus obtained acoustic wave devices, the chipping size in the first side face was 2.0 ∝m (0.5 of λ), and the chipping size in the second side face was 50 ∝m (12.5 times λ).

TABLE 1

| | | processing conditions | | | | | | |
|---|---|---|---|---|---|---|---|---|
| | wavelength λ | processing surface | blade thickness | particle size | number of revolutions | feeding speed | amount of chipping | spurious intensities |
| Example 1 | 4 μm | first side face | 0.05 mm | #2000 | 29000 rpm | 20 mm/s | 0.4 μm (0.1λ) | 2 dB |
| | | second side face | 0.1 mm | #500 | 29000 rpm | 50 mm/s | 50 μm (12.5λ) | |
| Example 2 | 4 μm | first side face | 0.05 mm | #2000 | 29000 rpm | 20 mm/s | 0.4 μm (0.1λ) | 2.7 dB |
| | | second side face | 0.05 mm | #1500 | 29000 rpm | 20 mm/s | 2 μm (0.5λ) | |
| Example 3 | 4 μm | first side face | 0.05 mm | #2000 | 29000 rpm | 20 mm/s | 0.4 μm (0.1λ) | 2.5 dB |
| | | second side face | 0.1 mm | #300 | 29000 rpm | 50 mm/s | 200 μm (50λ) | |
| Comparative Example 1 | 4 μm | first side face | 0.05 mm | #2000 | 29000 rpm | 20 mm/s | 0.4 μm (0.1λ) | 5 dB |
| | | second side face | 0.05 mm | #2000 | 29000 rpm | 20 mm/s | 0.4 μm (0.1λ) | |
| Comparative Example 2 | 4 μm | first side face | 0.05 mm | #2000 | 29000 rpm | 20 mm/s | 0.4 μm (0.1λ) | 7 dB |
| | | second side face | 0.1 mm | #300 | 29000 rpm | 100 mm/s | 240 μm (60λ) | |
| Comparative Example 3 | 4 μm | first side face | 0.05 mm | #1500 | 29000 rpm | 20 mm/s | 2.0 μm (0.5λ) | 7 dB |
| | | second side face | 0.1 mm | #500 | 29000 rpm | 50 mm/s | 50 μm (12.5λ) | |

[Evaluation]

Characteristics of single-port resonators according to Working Examples 1 to 3 and Comparative Examples 1 to 3 were evaluated. As summarized in Table 1, the intensity of spurious peaks ranged 2 to 2.7 dB in Working Examples 1 to 3 but ranged 5 to 7 dB in Comparative Examples 1 to 3. The results show that, in terms of suppressing the occurrence of spurious peaks, it is preferable to set the chipping size in the first side face to 1/10 of the wavelength λ of the acoustic wave or smaller and the chipping size in the second side face to 1/2 of the wavelength λ of the acoustic wave or larger and 50 times the wavelength λ or smaller (particularly, 12.5 times the wavelength λ or larger and 50 times the wavelength λ or smaller).

Needless to say, the above working examples do not limit the present invention in any way.

What is claimed is:

1. An end surface reflection-type acoustic wave device comprising a substantially rectangular-parellelpiped composite substrate in which a supporting substrate and a piezoelectric substrate are joined together, with a pair of IDT electrodes provided on the piezoelectric substrate in such a manner as to be intercalated with each other, wherein a first chipping size of a first concavity and convexity formed in a first side face of the piezoelectric substrate is 1/10 of a wavelength λ of an acoustic wave or smaller, the first side face extending orthogonally to a direction of acoustic-wave propagation, wherein a second chipping size of a second concavity and convexity formed in a second side face of the piezoelectric substrate is larger than the first chipping size in the first side face and is 1/2 of the wavelength λ of the acoustic wave or larger and 50 times the wavelength λ of the acoustic wave or smaller, the second side face extending in the direction of acoustic-wave propagation, and wherein the second concavity and convexity is formed randomly along the direction of acoustic-wave propagation.

2. The acoustic wave device according to claim 1, wherein the chipping size in the second face is 12.5 times the wavelength λ of the acoustic wave or larger and 50 times the wavelength λ of the acoustic wave or smaller.

3. The acoustic wave device according to claim 1, wherein the supporting substrate has a smaller coefficient of thermal expansion than the piezoelectric substrate.

4. The acoustic wave device according to claim 1, wherein the second side face is a cut surface having the second concavity and convexity which is cut by a blade.

5. The acoustic wave device according to claim 1, wherein the concavity and convexity is formed at the whole surface of the second side face.

6. The acoustic wave device according to claim 2, wherein the supporting substrate has a smaller coefficient of thermal expansion than the piezoelectric substrate.

7. The acoustic wave device according to claim 2, wherein the second side face is a cut surface having the second concavity and convexity which is cut by a blade.

8. The acoustic wave device according to claim 2, wherein the concavity and convexity is formed at the whole surface of the second side face.

9. The acoustic wave device according to claim 3, wherein the second side face is a cut surface having the second concavity and convexity which is cut by a blade.

10. The acoustic wave device according to claim 3, wherein the concavity and convexity is formed at the whole surface of the second side face.

* * * * *